United States Patent [19]

Loewen

[11] Patent Number: 4,952,799
[45] Date of Patent: Aug. 28, 1990

[54] REFLECTIVE SHAFT ANGLE ENCODER

[75] Inventor: Victor D. Loewen, San Jose, Calif.

[73] Assignee: Hewlett-Packard Company, Palo Alto, Calif.

[21] Appl. No.: 321,994

[22] Filed: Mar. 10, 1989

[51] Int. Cl.$^5$ .............................................. G01D 5/34
[52] U.S. Cl. ............................ 250/231.16; 250/237 G
[58] Field of Search ........ 250/231 SE, 237 G, 231.16; 341/13

[56] References Cited

U.S. PATENT DOCUMENTS

| 4,031,386 | 6/1977 | Recker | 250/231 SE |
| 4,451,731 | 5/1984 | Leonard | 250/231 SE |
| 4,508,965 | 4/1985 | Casciani | 250/231 SE |
| 4,650,995 | 3/1987 | Tokunaga | 250/231 SE |
| 4,691,101 | 9/1987 | Leonard | 250/231 SE |
| 4,794,250 | 12/1988 | Togami | 250/231 SE |

Primary Examiner—David C. Nelms
Assistant Examiner—Sherrie Hsia

[57] ABSTRACT

An optical shaft angle encoder has a code wheel with alternating reflective and non-reflective areas in a circumferential path on one face of the wheel. A light emitting diode is spaced apart from the reflective areas on the wheel. Four photodetectors are also spaced apart from the same face of the wheel so that, as the wheel rotates, the photodetectors are alternately illuminated or not illuminated by light from the light emitting diode that is reflected from the reflective areas. Preferably the light emitting diode is relatively nearer the shaft axis than the photodetectors and is in a radial direction from the shaft axis which bisects the array of photodetectors.

20 Claims, 4 Drawing Sheets

REFLECTIVE SHAFT ANGLE ENCODER

FIELD OF THE INVENTION

This invention relates to an optical shaft angle encoder for producing electrical signals indicative of the angular position or motion of a shaft. In particular, it employs a reflective encoder wheel so that all measurements may be made on the same face of the wheel, thereby reducing difficulty in making electrical connections. A light emitter and photodetectors are arranged on one side of the wheel.

BACKGROUND OF THE INVENTION

Incremental optical motion encoders are used for resolving the position or measuring rotation of a shaft. Exemplary shaft angle encoders are known from U.S. Pat. Nos. 4,451,731 and 4,691,101, for example. Such encoders include a light source for emitting a light beam, an encoder wheel for modulating the light beam in response to shaft rotation, and a detector assembly for receiving the modulated light and producing electrical signals indicating the amount of light received by the detectors.

As the light is modulated in response to shaft rotation, each electrical signal from the detector assembly produces a wave form. The position of the shaft determines the position of each signal on its particular wave form, that is, the phase of each signal. Thus, the electrical signals from the detectors can be used to indicate shaft rotation. Two or more properly out-of-phase signals, from separate detectors, can be used to indicate both direction and magnitude of rotation.

Typical shaft angle encoders have an opaque wheel with a plurality of transparent windows through which illumination passes. In the simplest embodiment, a light source is provided adjacent to one face of the wheel. A photodetector is placed on the opposite side of the wheel so that as the wheel rotates, light from the emitter is alternately passed through a window to the photodetector or occulted by an opaque area of the wheel. There may be a number of drawbacks to such an arrangement, particularly when relatively low-cost encoders are desired.

Much of this can stem from having the light emitter on one side of the wheel and the light detectors on the opposite side of the wheel. This means that there are two substrates to which electrical connections must be made. Having two substrates complicates the positioning and alignment of components to obtain a desired precision. Each of these adds significant cost to the encoder.

Further, to obtain precision and high contrast, it is commonly necessary to employ collimating optics for the light source. This adds an element of complexity and difficulty in assembly alignment and also enlarges the size of the encoder. In the modern world, it is almost universal that small size is desirable.

It is, therefore, desirable to produce a shaft angle encoder where the light emitters and photodetectors can be mounted on a single substrate.

BRIEF SUMMARY OF THE INVENTION

There is, therefore, provided in practice of this invention, according to a presently preferred embodiment, a shaft angle encoder having a rotatable code wheel with a plurality of alternating reflective and non-reflective areas extending in a circumferential path around the wheel. Means, such as a light emitting diode, are provided for illuminating the reflective areas. A plurality of photodetectors are arrayed on the same side of the code wheel as the light emitting diode, for receiving light which is directly reflected from the reflective areas on the code wheel. This produces a plurality of electrical signals indicative of code wheel position.

BRIEF DESCRIPTION OF THE DRAWINGS

These and other features and advantages of the present invention will be appreciated as the same becomes better understood by reference to the following detailed description when considered in connection with the accompanying drawings, wherein.

DETAILED DESCRIPTION

Figure 1:
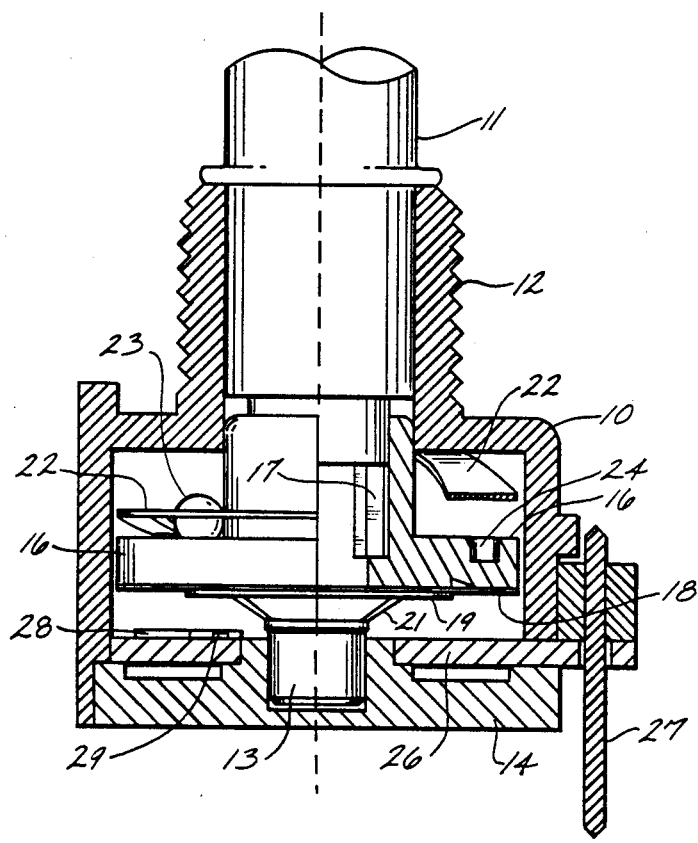
FIG. 1 is a longitudinal cross-section of a shaft angle encoder constructed according to principles of this invention.
Figure 2:
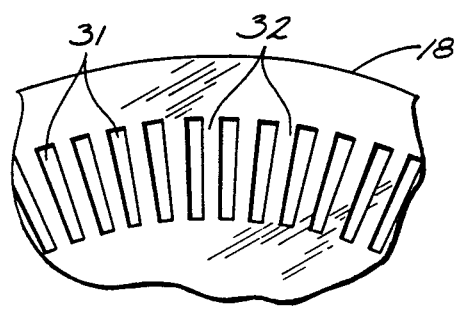
FIG. 2 is a fragmentary view of one face of an exemplary code wheel.

An exemplary shaft angle encoder constructed according to principles of this invention is built in an opaque square housing 10 through one side of which a shaft 11 extends. The shaft enters the housing through a threaded portion 12 which permits mounting the encoder on a panel or the like. The other end 13 of the shaft fits in a bearing socket in a back plate 14 which closes the housing. The shaft may be rotated by any of a broad variety of devices, or may be rotated manually.

A round hub 16 is mounted on a portion of the shaft having splines 17 which assure rotation of the hub with the shaft. In FIG. 1 of the drawings, the portion of the hub to the left of the centerline is illustrated in elevation, and to the right of the centerline, the hub is illustrated in cross-section. A code wheel 18 is held tightly against the hub, and the hub is held on the shaft by a conventional spring retention clip 19 having conical leaves 21 which frictionally engage the shaft. It should be recognized that the code wheel 18 is very thin (e.g. 50 micrometers) and is drawn somewhat exaggerated in thickness solely for purposes of illustration. To give an idea of scale, the code wheel in an exemplary embodiment has a diameter of a little over 13 millimeters.

On the opposite side of the hub from the code wheel, there is a generally circular detent spring 22 bearing against the inside of the housing, for biasing a detent ball 23 toward the back of the hub. A circumferentially extending band of detent holes 24 is formed in the back of the wheel for engaging the ball and providing a tangible indication of wheel rotation. The detent ball also serves to lightly restrain the hub in any of a plurality of positions corresponding to the detent holes. Such an arrangement is appropriate where the shaft may be manually adjusted. Such detents may be absent in other embodiments.

A printed circuit board 26 is mounted on the back plate and extends outside the housing. A conventional connector on the printed circuit board has a plurality of pins 27 for making electrical connections to components mounted on the board. Four such pins are sufficient when some data processing is performed within the housing. An integrated circuit and photodetector substrate 28 and a light emitting diode (LED) 29 are mounted on the printed circuit board in a location near the perimeter of the code wheel. The LED and photodetector substrate are located 45° around the shaft axis from a flat side of the square housing to provide additional space on the printed circuit board for these components.

In this embodiment, the code wheel has a highly reflective face opposite the emitter and photodetector substrate. By reflective, it is meant that the face is smooth and flat to provide specular reflection of the light, rather than diffuse reflection. A circumferentially extending band of essentially trapezoidal windows 31 are etched through the code wheel. The reflective space 32 between adjacent windows has essentially the same width as the windows. The band of windows overlies a conical groove 33 formed in the front face of the hub. Thus, the portion of the hub behind the band of windows through the code wheel has a surface that is not parallel to the reflective surface of the code wheel. Thus, any light passing through such a window will be reflected, if at all, in a direction different from light reflected specularly from the face of the code wheel. For this reason, the windows are regarded as non-reflective areas between reflective areas 32 between the windows.

Instead of reflecting the light in a different direction from the specular reflection from the code wheel, the non-reflective areas of the code wheel may be diffuse reflectors or absorbers. For example, absorbing areas might be formed with a one-quarter wave length interference layer for absorption of monochromatic light. Alternatively, the hub and code wheel could be made integral, such as by injection molding plastic. This type of code wheel has recessed areas angled to reflect light in directions different from reflection from the flat face of the code wheel. The recesses define areas that, for purposes of this invention, are non-reflective. With such an arrangement, the entire face of the code wheel/hub may be metallized for good specular reflection from the reflective areas, while still retaining non-reflective areas interspersed between the reflective areas. Also, the reflective areas may be curved instead of flat for concentrating light from the emitter onto a smaller photodetector area. Such curved surfaces may also be specular reflectors when smooth.

Thus, for purposes of this specification, a reflective area is regarded as an area that specularly reflects light from the emitter to the photodetectors and a non-reflective area is regarded as an area that does not so reflect, regardless of whether the light incident on the "non-reflective" area from the emitter is absorbed or reflected elsewhere.

Figure 3:
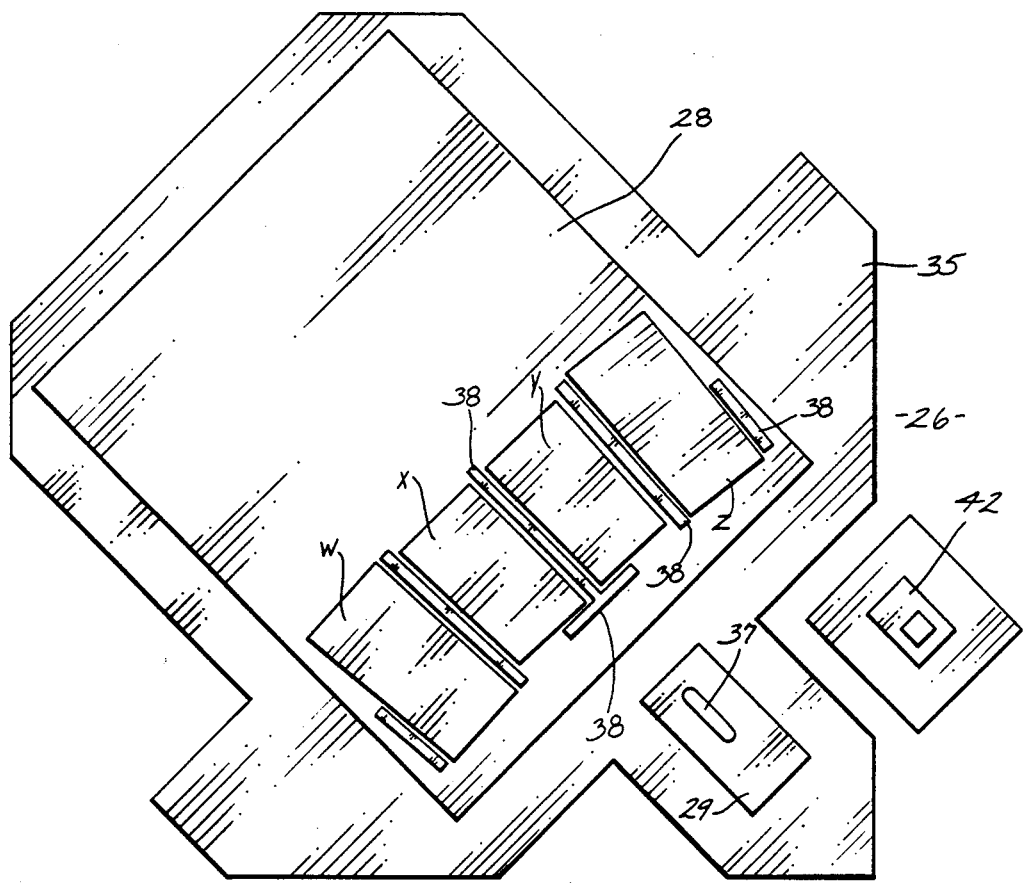
FIG. 3 is a face view of a substrate having a light emitter and photodetectors.

The LED and photodetector substrate are mounted on a gold grounding pad 35 on the printed circuit board. The LED 29 is positioned at a relatively smaller radial distance from the axis of the shaft than the integrated circuit chip 28 on which a plurality of photodetector areas w, x, y, z are formed. The LED is a conventional LED which emits essentially monochromatic light from a line 37 which extends in a radial direction from the shaft axis. As illustrated in FIG. 3, the line 37 has some width as it must necessarily have in any practical embodiment. In effect, the line is a point source of light elongated in a radial direction. In an exemplary embodiment, the light emitting line of the LED is about 64 micrometers wide and 320 micrometers long.

The integrated circuit chip includes four elongated photodiodes w,x,y,z which are arrayed in radial directions from the axis of the shaft. In between each of the photodiode areas, and outboard of the outermost photodiodes x,z, there are dummy doped areas 38 shorted to a conventional isolation layer or barrier for minimizing leakage current to and between the photodiodes.

The distance between adjacent photodiodes is the same as the width of the emitting line 37 of the LED. This helps compensate for the "non-sharp" edge of the illuminated area and minimizes dark current from the photodiodes, thereby enhancing contrast.

The integrated circuit chip 28 also includes conventional signal processing circuitry 39 (indicated only schematically in FIG. 6) including two comparators or operational amplifiers 41. A load resister 42 for the LED is mounted on the printed circuit board adjacent to the substrate. Other conventional individual circuit elements, wire bond pads, and electrical interconnections are omitted for clarity.

Signals from the four photodiodes are processed in substantially the same manner described in U.S. Pat. No. 4,691,101 by Leonard. The four signals from the photodiodes are compared by way of the operational amplifiers 41 to produce two channels of output logic by which the shaft position or motion can be determined.

In the illustrated embodiment, there are four photodetector areas suitable for a code wheel having 32 reflective areas in the circumferential path around the wheel. In other embodiments with larger numbers of reflective areas, it may be desirable to have more than one cycle of four photodiodes. For example, in an embodiment having 64 reflective areas on the code wheel, it is desirable to employ eight photodetector areas connected in quadrature as described in the Leonard patent. Further, with a code wheel having 120 reflective areas, it is desirable to employ three cycles of four photodetector areas or a total of twelve.

The light emitting line 37 of the LED lies in a radial direction bisecting the array of photodiodes w,x,y,z. The circumferential path of the alternating reflective and non-reflective areas on the code wheel lies at radial distance from the shaft axis mid-way between the LED and photodetectors. Thus, light emitted from the LED striking a reflective area on the code wheel is reflected for illuminating a photodetector. The photodetectors are preferably further from the axis of the shaft than the LED so that the area available for forming the photodetectors is larger.

Figure 4:
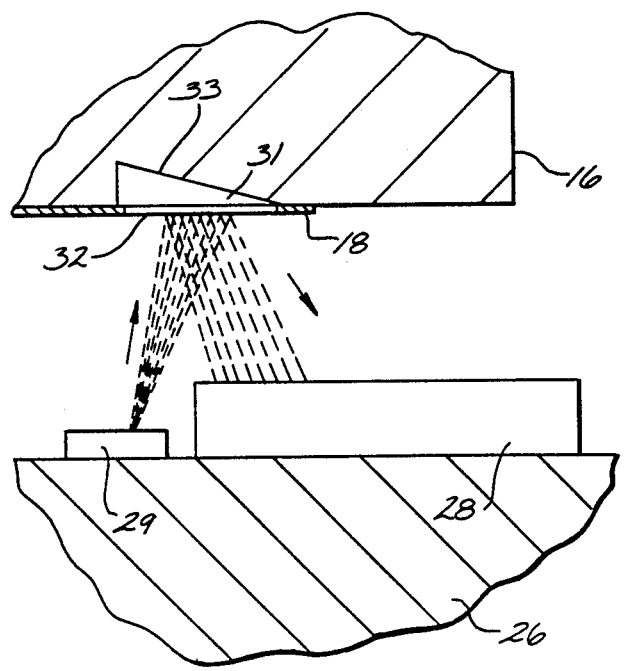
FIG. 4 is a fragmentary, enlarged semi-schematic cross-section including a fragment of the code wheel of the encoder.
Figure 5:
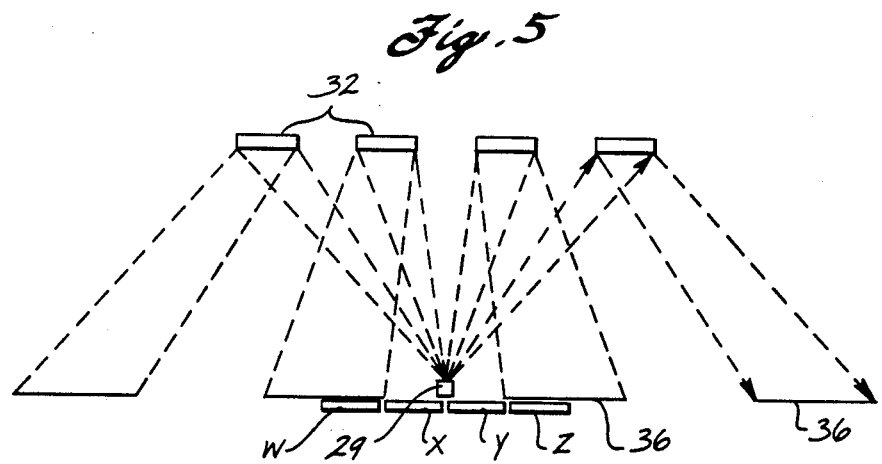
FIG. 5 is a schematic illustration of illumination of photodetectors by light from such a light emitter.
Figure 6:
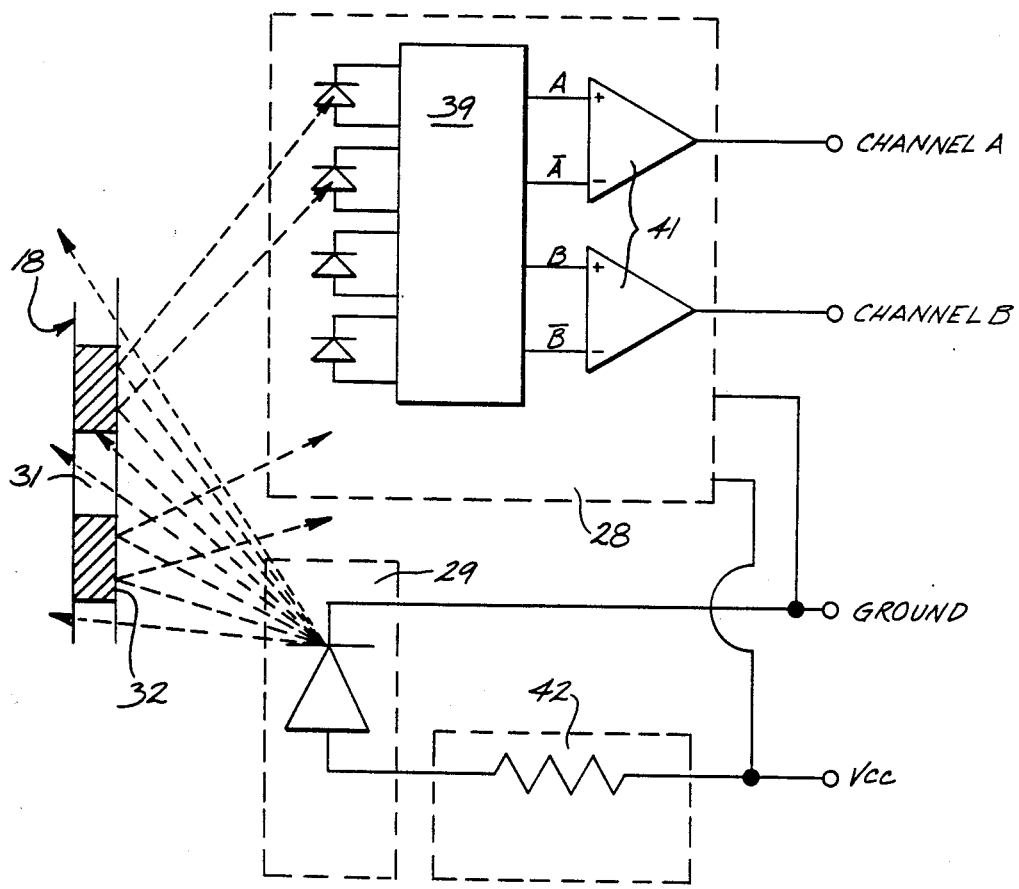
FIG. 6 is a block diagram of an encoder, with illumination indicated schematically.

The general pattern of such illumination is illustrated schematically by dashed lines in FIGS. 4 to 6 wherein it is assumed that illumination arises from a point source (a line source is, in effect, a row of point sources). FIG. 4 illustrates the illumination in a radial plane, while FIG. 5 illustrates illumination in a circumferential direction.

One thing that should be apparent from the drawings is that the cycle of four photodetector areas has approximately twice the width of each cycle of one reflective area and one non-reflective area on the code wheel. In an encoder employing collimated light and a measurement technique as described in the Leonard patent, the width of one photodetector cycle (four photodetectors) is the same as one cycle on the code wheel.

In the reflective encoder provided herein, the light diverges from the light source toward the reflective areas. It is reflected at the angle of incidence and travels substantially the same distance back to the photodetectors. Thus, it continues to diverge, and the area illuminated (indicated by reference numeral 36 in FIG. 5) is twice as wide as the reflective area. Thus, for encoding in the same manner as in the Leonard patent, the width of the full cycle of four detectors should be twice as wide as the cycle on the code wheel. Likewise, each individual photodetector area is the same width as either a window or the reflective area between windows.

This relation does not precise for several reasons. Although the LEDs and photodetectors in the illustrated embodiment are approximately in a plane parallel to the plane of the code wheel, they are not quite in the same plane. The divergence of the light is therefore slightly less from the reflector to the photodetectors than from the LED to the reflective area. Parallax also spreads the illuminated area on a plane parallel to the illuminated area as the angle of reflection becomes increasingly different from 90°. The width of the emitting line on the LED is finite. Physical limitations on the spacing of semiconductor areas on the integrated circuit chip also influence the width of photodetectors actually used. These discrepancies are minor, however, and the width relation is nearly as stated.

It will also be apparent that the photodetectors are alternately illuminated and not illuminated as the band of reflective areas rotates. Thus, the signals by the photodiodes are essentially the same as, and can be processed in the same manner as, the signals transmitted through windows in the code wheel of the Leonard patent.

The photodetector areas w,y closest to and on opposite sides of the radial direction bisecting the array of photodetectors may be made slightly smaller than the outboard photodetector areas x,z. The length of the optical path between the LED and the outboard photodetector areas is slightly longer than the path to the inboard photodetectors. The light intensity at the outboard photodiodes is therefore slightly less. The photodetector area is, therefore, increased so that approximately the same total flux illuminates each of the photodetector areas. This refinement is of less significance when two or more cycles of photodetectors are used, since the flux from inboard and outboard photodetectors in the channel are integrated.

Although but one embodiment of optical shaft angle encoder has been described and illustrated herein, many modifications and variations will be apparent to one skilled in the art. Thus, for example, in this embodiment, there is a single band of alternating reflective and non-reflective areas extending circumferentially on the code wheel. This is sufficient where the information desired is the magnitude of rotation of the shaft, rather than absolute shaft position. If the position is significant, index marks may also be provided on the code wheel for determining position in a conventional manner.

A distinct advantage of the arrangement described and illustrated is the absence of need for any lensing associated with the light emitting device, light being emitted more or less isotropically. However, it will be recognized that light intensity may be enhanced by a concentrating lens at the LED that minimizes the amount of light illuminating areas that cannot reflect toward the photodetectors.

The reflective and intervening non-reflective areas on the code wheel are illustrated as extending radially. For wheels with a small number of cycles around the circumference, it may be desirable to employ spirally extending reflective areas and non-reflective areas for greater sensitivity. Many other modifications and variations will be apparent to those skilled in the art, and it is therefore to be understood that, within the scope of the appended claims, the invention may be practiced otherwise than as specifically described.

What is claimed is:

1. A shaft angle encoder comprising:
   a rotatable code wheel comprising a plurality of alternating reflective and non-reflective areas extending in a circumferential path around the wheel;
   a light emitting device elongated in a radial direction for illuminating the circumferential path;
   a plurality of photodetectors having elongated detection areas extending in a radial direction arrayed side by side on the same side of the code wheel as the light emitting device for receiving light from the light emitting device which is reflected from reflective areas on the code wheel; and
   comparator means for comparing signals from the photodetectors and producing signals indicative of code wheel rotation.

2. A shaft angle encoder comprising:
   a rotatable code wheel comprising a plurality of alternating reflective and non-reflective areas extending in a circumferential path around the wheel;
   a light emitting device for directly illuminating the circumferential path;
   a plurality of photodetectors arrayed side by side on the same side of the code wheel as the light emitting device for receiving light from the light emitting device which is directly reflected from reflective areas on the code wheel;
   wherein the photodetectors and light emitting device are in the same plane, which plane is parallel to the plane of the code wheel; and
   comparator means for comparing signals from the photodetectors and producing signals indicative of code wheel rotation.

3. A shaft angle encoder comprising:
   a rotatable code wheel comprising a plurality of alternating reflective and non-reflective areas extending in a circumferential path around the wheel;
   a light emitting device for illuminating the circumferential path;
   a plurality of photodetectors arrayed side by side on the same plane as the light emitting device, which plane is parallel to the plane of the code wheel, for receiving light from the light emitting device which is reflected from reflective areas on the code wheel, the width of each cycle of photodetectors being twice the width of each cycle of reflective and non-reflective areas; and
   comparator means for comparing signals from the photodetectors and producing signals indicative of code wheel rotation.

4. A shaft angle encoder comprising:
   a rotatable code wheel comprising a plurality of alternating reflective and non-reflective areas extending in a circumferential path around the wheel;
   a light emitting device for illuminating the circumferential path;
   a plurality of photodetectors arrayed side by side on the same side of the code wheel as the light emitting device for receiving light from the light emitting device which is reflected from reflective areas on the code wheel, wherein the light emitting device is at one radial distance from the axis of the code wheel and the photodetectors are at a different radial distance from the axis of the code wheel; and comparator means for comparing signals from the photodetectors and producing signals indicative of code wheel rotation.

5. A shaft angle encoder as recited in claim 4 wherein the light emitting device is relatively nearer the axis and the photodetectors are relatively further from the axis.

6. A shaft angle encoder as recited in claim 4 wherein the light emitting device is in a radial direction bisecting the array of photodetectors.

7. A shaft angle encoder comprising:
a rotatable code wheel comprising a plurality of alternating reflective and non-reflective areas extending in a circumferential path around the wheel, wherein the non-reflective areas comprise windows in the code wheel and a non-reflective region beyond the opposite face of the code wheel;
a light emitting device for illuminating the circumferential path;
a plurality of photodetectors arrayed side by side on the same side of the code wheel as the light emitting device for receiving light from the light emitting device which is reflected from reflective areas on the code wheel; and
comparator means for comparing signals from the photodetectors and producing signals indicative of code wheel rotation.

8. A shaft angle encoder comprising:
a rotatable code wheel comprising a plurality of alternating reflective and non-reflective areas extending in a circumferential path around the code wheel on one face of the code wheel;
a light emitting device for directly illuminating the circumferential path;
a plurality of photodetectors arrayed side by side on the same side of the code wheel as the light emitting device for receiving light from the light emitting device which is directly reflected from reflective areas on the code wheel; and
comparator means for comparing signals from the photodetectors and producing signals indicative of code wheel rotation.

9. A shaft angle encoder comprising:
a rotatable code wheel comprising a plurality of alternating reflective and non-reflective areas extending in a circumferential path around the wheel;
a light emitting device for directly illuminating the circumferential path;
at least four photodetectors arrayed side by side on the same side of the code wheel as the light emitting device for receiving light from the light emitting device which is directly reflected from reflective areas on the code wheel; and
comparator means for comparing signals from the four photodetectors to produce two output channels of information indicative of shaft position and code wheel rotation.

10. A shaft angle encoder comprising:
a rotatable code wheel comprising a plurality of alternating reflective and non-reflective areas extending in a circumferential path around the wheel;

a light emitting device for illuminating the circumferential path;
a plurality of photodetectors arrayed side by side on the same side of the code wheel as the light emitting device for receiving light from the light emitting device which is reflected from reflective areas on the code wheel;
comparator means for comparing signals from the photodetectors and producing signals indicative of code wheel rotation; and
a plurality of detents on the opposite face of the wheel from the reflective areas for tangibly indicating wheel position.

11. A shaft angle encoder comprising:
a rotatable code wheel having a plurality of reflective areas arrayed in a circumferentially extending path around the wheel;
light emitting means for emitting light along a line transverse to the circumferential path for illuminating the reflective areas; and
a plurality of photodetector areas elongated in a radial direction and arranged for illumination by light from the line of light emitting means which is reflected from each of a plurality of the reflective areas, for producing a plurality of electrical signals indicative of a code wheel position.

12. A shaft angle encoder comprising:
a rotatable code wheel having a plurality of reflective areas arrayed in a circumferentially extending path around the wheel;
light emitting means for emitting light along a line transverse to the circumferential path for illuminating the reflective areas; and
a plurality of photodetector areas arranged for illumination by light from the light emitting means which is reflected from each of a plurality of the reflective areas, for producing a plurality of electrical signals indicative of a code wheel position; and wherein the light emitting means and the photodetector areas are equidistant from the code wheel and the width of each cycle of photodetector area is twice the width of each cycle of reflective and non-reflective areas.

13. A shaft angle encoder comprising:
a rotatable code wheel having a plurality of reflective areas arrayed in a circumferentially extending path around the wheel;
light emitting means for emitting light along a line transverse to the circumferential path for illuminating the reflective areas; and
a plurality of photodetector areas arranged for illumination by light from the light emitting means which is reflected from each of a plurality of the reflective areas, for producing a plurality of electrical signals indicative of a code wheel position, wherein the light emitting means is at a relatively smaller radial distance from the axis of the code wheel and the photodetectors are at a relatively larger radial distance from the axis of the code wheel.

14. A shaft angle encoder as recited in claim 13 wherein the light emitting device is in a radial direction bisecting the array of photodetectors.

15. A shaft angle encoder comprising:
a rotatable code wheel having a plurality of reflective areas arrayed in a circumferentially extending path around the wheel;

light emitting means for emitting light along a line transverse to the circumferential path for illuminating the reflective areas; and a plurality of photodetector areas arranged for illumination by light from the light emitting means which is reflected from each of a plurality of the reflective areas, for producing a plurality of electrical signals indicative of a code wheel position, wherein the distance between adjacent photodetectors is the same as the width of the emission line.

16. A shaft angle encoder comprising:

a rotatable code wheel comprising a plurality of alternating reflective and non-reflective areas extending in a circumferential path around one face of the wheel;

an effective point source light emitting device for illuminating the circumferential path; and at least one photodetector in the same plane as the light emitting device for producing electrical signals in response to light from the light emitting device which is reflected from reflective areas on the code wheel, wherein the light emitting device is at a relatively smaller radial distance from the axis of the code wheel and the photodetector is at a relatively larger radial distance from the axis of the code wheel.

17. A shaft angle encoder as recited in claim 16 wherein both the light emitting device and the photodetector are elongated in a radial direction.

18. An optical shaft angle encoder comprising:
an opaque housing;
a rotatable shaft mounted in the housing;
a hub rotatable with the shaft and including a plurality of detent holes on a back face;
a detent ball and means for biasing the detent ball toward engagement with the detent holes for tangibly indicating wheel position;
a plurality of alternating reflective and non-reflective areas in a circumferential band on a front face of the hub;
a light emitting diode spaced apart from the reflective areas on the front face of the hub; and
a plurality of photodetectors spaced apart from the reflective areas on the front face of the hub the same distance as the light emitting diode, the photodetectors being spaced apart from the shaft axis a greater distance than the light emitting diode is spaced from the shaft axis for illumination by light from the light emitting diode that is reflected from the reflective areas, the array of photodetectors being bisected by a radial plane through the light emitting diode.

19. An optical shaft angle encoder as recited in claim 18 wherein the alternating reflective and non-reflective areas comprise a non-reflective groove in the front face of the hub and a reflective code wheel adjacent to the front face of the hub, and having a circumferentially extending band of windows through the code wheel.

20. An optical shaft angle encoder as recited in claim 18 wherein the light emitting diode is elongated in a radial direction and the photodetectors are elongated in a radial direction.

* * * * *